(12) United States Patent
Bowles et al.

(10) Patent No.: US 10,442,685 B2
(45) Date of Patent: Oct. 15, 2019

(54) MICROELECTRONIC PACKAGES HAVING HERMETIC CAVITIES AND METHODS FOR THE PRODUCTION THEREOF

(71) Applicants: Philip H. Bowles, Gilbert, AZ (US); Stephen R. Hooper, Mesa, AZ (US)

(72) Inventors: Philip H. Bowles, Gilbert, AZ (US); Stephen R. Hooper, Mesa, AZ (US)

(73) Assignee: NXP USA, Inc., Austin, TX (US)

( * ) Notice: Subject to any disclaimer, the term of this patent is extended or adjusted under 35 U.S.C. 154(b) by 252 days.

(21) Appl. No.: 14/230,975

(22) Filed: Mar. 31, 2014

(65) Prior Publication Data
US 2016/0167952 A1 Jun. 16, 2016

(51) Int. Cl.
*B81B 7/00* (2006.01)
*B81B 7/02* (2006.01)
*B81C 1/00* (2006.01)

(52) U.S. Cl.
CPC ............ *B81B 7/02* (2013.01); *B81B 7/0041* (2013.01); *B81C 1/0023* (2013.01); *B81C 1/00293* (2013.01); *B81B 2201/0235* (2013.01); *B81B 2201/0242* (2013.01); *H01L 2224/48091* (2013.01); *H01L 2924/181* (2013.01)

(58) Field of Classification Search
CPC .......................... B81B 7/0041; B81C 1/00293
USPC ........................................................ 257/415
See application file for complete search history.

(56) References Cited

U.S. PATENT DOCUMENTS

| | | | |
|---|---|---|---|
| 6,846,725 B2 | 1/2005 | Nagarajan et al. | |
| 8,250,921 B2 | 8/2012 | Nasiri et al. | |
| 2008/0314118 A1* | 12/2008 | Bey, Jr. ................ | G01D 21/02 73/29.02 |
| 2012/0212925 A1 | 8/2012 | Zoellin et al. | |
| 2012/0260747 A1* | 10/2012 | Chen ................... | G01L 19/0092 73/863 |
| 2013/0277777 A1* | 10/2013 | Chang ..................... | B81B 7/00 257/418 |
| 2015/0197419 A1* | 7/2015 | Cheng .................. | B81B 7/0006 257/418 |

FOREIGN PATENT DOCUMENTS

CN 101643193 A 2/2010

OTHER PUBLICATIONS

Hooper, Stephen R., US Patent Application entitled "Sensor Device Packages and Related Fabrication Methods," filed on Oct. 18, 2013.

* cited by examiner

*Primary Examiner* — Hsin Yi Hsieh

(57) ABSTRACT

Microelectronic packages having hermetic cavities are provided, as are methods for producing such packages. In one embodiment, the microelectronic package includes a sensor die having first and second Microelectromechanical Systems (MEMS) transducer structures formed thereon. First and second cap pieces are coupled to the sensor die by, for example, direct or indirect bonding. A first hermetic cavity encloses the first MEMS transducer structure and is at least partially defined by the first cap piece and the sensor die. Similarly, a second hermetic cavity encloses the second MEMS transducer structure and at least partially defined by the second cap piece and the sensor die. A vent hole is fluidly coupled to the first hermetic cavity and is sealed by the second cap piece.

8 Claims, 5 Drawing Sheets

MICROELECTRONIC PACKAGES HAVING HERMETIC CAVITIES AND METHODS FOR THE PRODUCTION THEREOF

TECHNICAL FIELD

Embodiments of the present invention relate generally to microelectronic packaging and, more particularly, to microelectronic packages having hermetic cavities enclosing Microelectromechanical Systems devices, as well as to methods for the fabrication thereof.

BACKGROUND

Microelectronic packages are now commonly produced to contain two or more multi-axis sensors, such as a three axis Microelectromechanical Systems (MEMS) accelerometer and a three axis MEMS gyroscope. The transducer structures for the MEMS accelerometer and the MEMS gyroscope may be formed on a single die in, for example, a side-by-side relationship. Performance of the microelectronic package can be enhanced by enclosing the MEMS transducer structures in fluidly-isolated cavities, each containing a different pressure tailored to the particular type of transducer structure enclosed thereby. One or more thin film layers can be utilized to produce fluidly-isolated cavities enclosing the MEMS transducer structures; however, the usage of thin film layers is associated with certain limitations, such as relatively poor mechanical strength and seal integrity. A more structurally robust package can be produced by bonding a solid cap piece lacking active circuitry (a "dummy cap") over the MEMS transducer structures to create a single, hermetically-sealed cavity. However, such an approach generally requires that the accelerometer and gyroscope transducer structures are exposed to a common pressure, which can negatively impact the performance of the microelectronic package. Additionally, the inclusion of a dummy cap can add undesired bulk and cost to the microelectronic package.

It is thus desirable to embodiments of a microelectronic package including two or more MEMS transducer structures, which are enclosed within separate, fluidly-isolated cavities in a structurally robust manner. Ideally, embodiments of such a microelectronic package would have a reduced size and manufacturing cost as compared conventional microelectronic packages. It would also be desirable to provide embodiments of a microelectronic package, which contains at least one MEMS transducer structure enclosed within a hermetic cavity in addition to another microelectronic device (e.g., a magnetometer die) and which has a reduced height or thickness. Finally, it would be desirable to provide methods for producing microelectronic packages having one or more of the foregoing characteristics. Other desirable features and characteristics of the present invention will become apparent from the subsequent Detailed Description and the appended Claims, taken in conjunction with the accompanying Drawings and the foregoing Background.

BRIEF DESCRIPTION OF THE DRAWINGS

At least one example of the present invention will hereinafter be described in conjunction with the following figures, wherein like numerals denote like elements, and.

Figure 1:
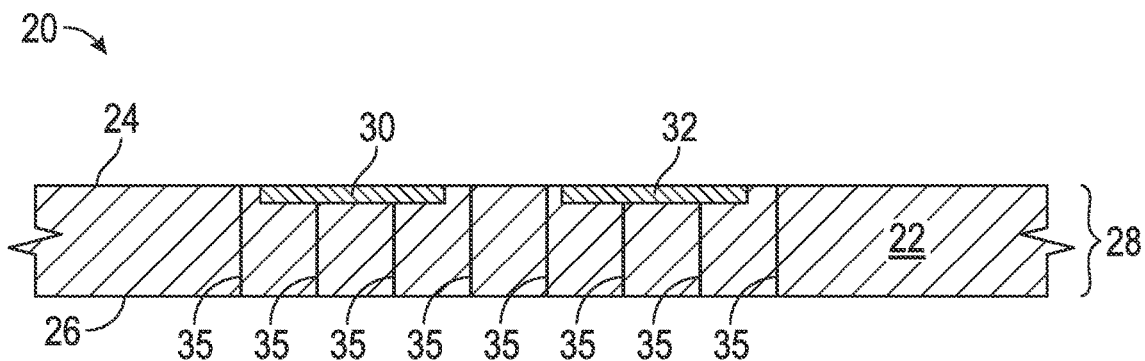
FIGS. 1-5 are simplified cross-sectional views of a microelectronic package shown at various stages of completion and including two fluidly-isolated cavities sealed by two cap pieces positioned on the same side of a sensor die, as illustrated in accordance with a first embodiment of the present invention.

For simplicity and clarity of illustration, the drawing figures illustrate the general manner of construction, and descriptions and details of well-known features and techniques may be omitted to avoid unnecessarily obscuring the exemplary and non-limiting embodiments of the invention described in the subsequent Detailed Description. It should further be understood that features or elements appearing in the accompanying figures are not necessarily drawn to scale unless otherwise stated. For example, the dimensions of certain elements or regions in the figures may be exaggerated relative to other elements or regions to improve understanding of embodiments of the invention.

DETAILED DESCRIPTION

The following Detailed Description is merely exemplary in nature and is not intended to limit the invention or the application and uses of the invention. Any implementation described herein as exemplary is not necessarily to be construed as preferred or advantageous over other implementations. Furthermore, there is no intention to be bound by any theory presented in the preceding Background or the following Detailed Description.

As appearing herein, the term "microelectronic component" is utilized in a broad sense to refer to an electronic device, element, or structure produced on a relatively small scale and amenable to packaging in the below-described manner. Microelectronic components include, but are not limited to, integrated circuits formed on semiconductor die, MEMS devices, passive electronic components (e.g., a discrete resistor, capacitor, inductor, or diode), optical devices, and other small scale electronic devices capable of providing processing, memory, sensing, radiofrequency, optical, and actuator functionalities, to list but a few examples. The term "wafer" is utilized to encompass bulk semiconductor (e.g., silicon) wafers, layered structures (e.g., silicon-on-insulator substrates), and other structures over which number of semiconductor devices, MEMS devices, or the like can be produced utilizing global or wafer-level processing techniques. The term "die" is utilized in reference to a singulated piece of a wafer on which one or more integrated circuits, MEMS devices, and/or another microelectronic component has fabricated via wafer-level processing of the wafer. Finally, as still further appearing herein, the phrase "produced on," the phrase "fabrication on," and the like encompass the terms "over" and "in" such that a device "fabricated on" a semiconductor wafer may be produced over a principal surface thereof, in the body of the wafer, or a combination thereof.

The following describes microelectronic packages and methods for fabricating microelectronic packages including MEMS transducer structures enclosed within hermetically-sealed cavities. Embodiments of the microelectronic package may include any MEMS transducer structure or structures that are desirably enclosed within hermetically-sealed cavities containing known internal pressures. Such MEMS transducer structures include, but are not necessarily limited to, MEMS accelerometer structures, MEMS gyroscope structures, and MEMS pressure sensor structures. In many embodiments, the microelectronic package will include at least two fluidly-isolated cavities, which enclose different MEMS transducer structures and which contain disparate pressures. In this manner, the pressure within each cavity can be tailored to optimize the performance of the particular MEMS transducer structure enclosed thereby. During the manufacture of the microelectronic package, the first cavity may be sealed utilizing a first cap piece, while the first cavity is maintained in fluid communication with the surrounding pressure by a vent hole formed in the first cap piece or in the die carrying the MEMS transducer structures (referred to herein as the "sensor die"). The second cavity may subsequently sealed utilizing a second cap piece, which is positioned over the vent hole. Such a dual cap architecture allows the fluidly-isolated cavities to be produced in a structurally robust manner. Additionally, the cap pieces and the sensor die can be bonded and processed while in wafer form to allow a relatively large number of microelectronic packages to be produced in parallel. If desired, an Application Specific Integrated Circuit (ASIC) can be formed on one or both of the cap pieces to eliminate the need for a discrete ASICs die of the type included within known microelectronic packages. This, in turn, allows a reduction in overall package size and fabrication costs. Exemplary embodiments of microelectronic packages having such a dual cap architecture are described below in conjunction with FIGS. 1-7.

In further embodiments, the microelectronic package can be produced to include a magnetometer die or other relatively small microelectronic component, which is nested or housed within a recess formed in a cap piece or in the sensor die. The recess may be fluidly coupled to or integrally formed with a hermetically-sealed cavity, which sealingly encloses a MEMS transducer structure. In such embodiments, the microelectronic package may or may not include multiple cap pieces. However, it is generally advantageous to produce the microelectronic package to include both a nested configuration and a dual cap architecture of the type described above. For example, a three axis magnetometer can be nested at least partially within a cap piece and/or within a sensor die carrying both a three axis accelerometer and a three axis gyroscope to yield a highly compact microelectronic package having at least nine Degrees of Freedom (DOF). By virtue of the above-described dual cap structure, the 9-DOF microelectronic package may further be produced to include two fluidly-isolated cavities separately enclosing the three axis accelerometer and the three axis gyroscope at different pressures to enhance performance, while also providing a structurally robust package. In this case, the recess may be wholly internal to the package and fluidly coupled to the hermetic cavity enclosing the MEMS accelerometer structure or to the hermetic cavity enclosing the MEMS gyroscope structure; although it may be preferred that the recess is fluidly coupled to the cavity enclosing the MEMS accelerometer structure, which is less sensitive to pressure fluctuations due to any outgassing from the microelectronic component. Examples of microelectronic packages having such a nested design in addition to a dual cap construction are further described below in conjunction with FIGS. 8 and 9.

FIGS. 1-5 are simplified cross-sectional views of a microelectronic package 20, as shown at various stages of manufacture and produced in accordance with a first exemplary embodiment of the present invention. As shown in FIGS. 1-5 and further described below, package 20 is offered by way of non-limiting example only; it is emphasized that the below-described fabrication process can be utilized to produce microelectronic packages having other structural features. Furthermore, the fabrication steps described below in conjunction with FIGS. 1-5 can be performed in alternative orders, certain steps may be omitted in alternative embodiments, and additional steps may be performed in alternative embodiments. Description of structures and processes known within the microelectronic device and semiconductor industries may be limited or omitted entirely without providing the well-known process details. Referring initially to FIG. 1, microelectronic package 20 includes a sensor die 22 having a first principal surface or "frontside" 24 and second, opposing principal surface or "backside" 26. At this stage of manufacture, sensor die 22 remains in wafer form and is integrally joined to number of other non-illustrated sensor die, which collectively make-up a sensor wafer. A limited portion of the sensor wafer encompassing sensor die 22 is shown in FIG. 1 and identified by reference numeral "28." While the following description focuses primarily on the processing of the region of wafer 28 from which microelectronic package 20 is produced, it will be appreciated that the below-described processing steps are generally performed globally across wafer 28 (and the other wafers utilized to produce microelectronic package 20) to fabricate a number of other microelectronic packages in parallel with package 20.

First and second MEMS transducer structures 30 and 32 are formed at different locations on frontside 24 of sensor die 22. MEMS transducer structures 30 and 32 are preferably formed in close proximity in, for example, a side-by-side relationship. In one embodiment, either MEMS transducer structure 30 or MEMS transducer structure 32 is a three axis accelerometer structure, while the other of structures 30 and 32 is a three axis gyroscope structure. In this case, microelectronic package 20 may include at least six DOFs, which are attributable to transducer structures 30 and 32. This notwithstanding, structures 30 and 32 can be any MEMS transducer structures beneficially enclosed in fluidly-isolated cavities containing different internal pressures. For example, in further embodiments, MEMS transducer structure 30 or MEMS transducer structure 32 may be a pressure sensor transducer or diaphragm, which is exposed to a reference pressure contained within a hermetically-sealed cavity formed over structure 30 or structure 32 when microelectronic package 20 is completed.

While generically illustrated as having substantially equivalent widths in FIG. 1, it will be appreciated that the figures are not drawn to scale and that the relative dimensions of structures 30 and 32 may vary. In embodiments wherein transducer structure 30 is a MEMS gyroscope structure, while transducer structure 32 is MEMS accelerometer structure, the planform dimensions of transducer structure 30 may be considerably larger (e.g., twice the size of) the planform dimensions of transducer structure 32. As further shown in FIG. 1, a number of Through Silicon Vias (TSVs) 35 is formed through sensor die 22 to provide electrically-conductive paths between frontside 24 and backside 26 of sensor die 22. TSVs 35 thus allow single communication between circuitry formed on frontside 24 of sensor die 22 and an Input/Output (I/O) interface later produced over backside 26 of die 22, as described more fully below in conjunction with FIG. 5. In further embodiments, other interconnect features (e.g., wire bonds) may be utilized to provide electrical communication between the circuitry of sensor die 22 and the subsequently-formed I/O interface. The formation of TSVs 35 through sensor die 22 (and the formation of TSVs through the below-described cap pieces) may, however, facilitate interconnection during the wafer stacking process (also described below) and may reduce the overall planform dimensions of package 20 by eliminating the need for bond pads shelves, saw-to-reveal manufacturing steps, and other such processes and features associated with wire bonding.

Figure 2:
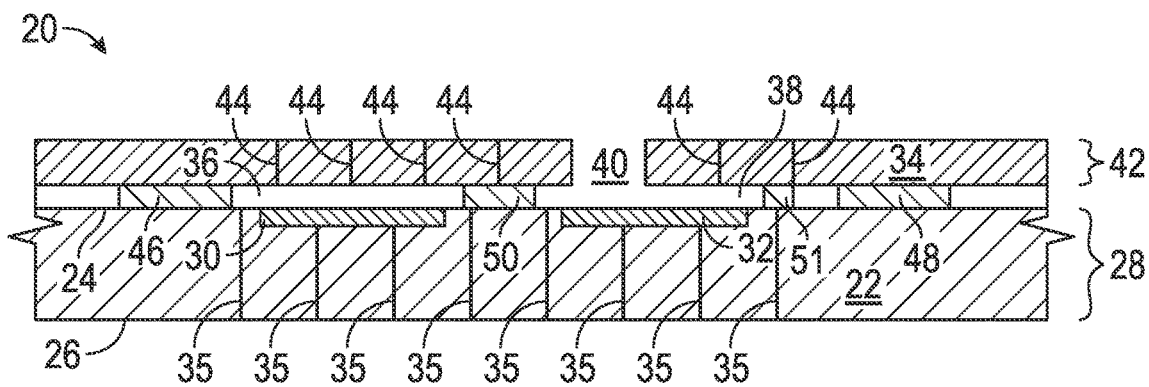

Turning to FIG. 2, a first cap piece 34 is bonded to frontside 24 of sensor die 22. First cap piece 34 cooperates with sensor die 22 to define a first hermetically-sealed MEMS cavity 36, which encloses MEMS transducer structure 30. First cap piece 34 and sensor die 22 also define, in substantial part, a second MEMS cavity 38 enclosing MEMS transducer structure 32. MEMS cavity 36 is hermetically sealed when first cap piece 34 is bonded to sensor die 22 such that, by controlling the process conditions at which bonding is carried-out, a desired internal pressure is sealed within cavity 36. In contrast, MEMS cavity 38 is vented to the surrounding pressure during the bonding process by at least one channel or orifice (referred to herein as a "vent hole"). The vent hole can be formed in any structure bounding cavity 38 and later sealed by bonding a second cap piece thereover. For example, as shown in FIG. 2, a vent hole 40 can be provided through the region of first cap piece 34 bounding cavity 38 and overlying MEMS transducer structure 32. Vent hole 40 may be drilled, etched, or otherwise formed in cap piece 34 prior to bonding to frontside 24 of sensor die 22; however, the possibility that vent hole 40 may be produced in cap piece 34 after bonding to die 22 in further embodiments of the fabrication method is by no means precluded. Once again, a number of TSVs 44 may be formed through cap piece 34 to provide signal communication between the opposing principal surfaces thereof.

At the juncture of manufacture shown in FIG. 2, cap piece 34 is preferably in wafer form and remains an integral part of a larger cap piece wafer 42 (partially shown), which bonded to sensor wafer 28 containing sensor die 22. Cap piece wafer 42 further includes a number of other non-illustrated cap pieces, which overly with the other sensor die included within sensor wafer 28 when wafers 28 and 42 are properly aligned. Prior to bonding to sensor wafer 28, cap piece wafer 42 may be processed to produce TSVs 44 therethrough, as well vent holes 40 in the desired locations. Bonding material may be utilized to bond cap piece wafer 42 to sensor wafer 28 and, more specifically, to bond cap piece 34 to sensor die 22. The bonding material can be deposited as rings (referred to herein as "seal rings") circumscribing or extending around the MEMS structures formed on sensor wafer 28. With respect to partially-completed package 20, specifically, bonding material is deposited around the perimeters of cavities 36 and 38 to form two seal rings: (i) a first seal ring 46, which extends around MEMS transducer structure 30, as taken along an axis orthogonal to frontside 24 of sensor die 22, and (ii) a second seal ring 48, which extends around MEMS transducer structure 32, as taken along an axis orthogonal to sensor die frontside 24. While shown in cross-section in FIG. 2, it will be appreciated that seal rings 46 and 48 each form a continuous 360° seal and may have a generally rectangular, square, circular, or other planform geometry. Seal rings 46 and 48 may (but need not always) include a shared portion 50, which serves as an intermediate wall partitioning neighboring hermetic cavities 36 and 38. Additional seal rings may likewise be deposited around the various other MEMS transducer structures formed on the non-illustrated portions of sensor wafer 28 and included within the microelectronic packages produced in parallel with package 20.

Any material suitable for creating a hermetic or gas-tight seal can be utilized to form seal rings 46 and 48 and the other non-illustrated seal rings deposited between sensor wafer 28 and cap piece wafer 42. A non-exhaustive list of suitable bonding materials includes aluminum-germanium alloy, copper, and copper alloys, which can be plated onto or otherwise deposited over selected regions of wafer 28 and/or wafer 42 prior to bonding. After deposition of seal rings 46 and 48 at the desired locations, a bonding process may be performed during which wafers 28 and 42 (and, more specifically, sensor die 22 and cap piece 34) are subject to convergent pressures and elevated temperatures sufficient to form the desired seals. The bonding process is preferably carried-out at a controlled pressure to impart fully-enclosed MEMS cavity 36 and the other non-illustrated, fully-enclosed cavities with a desired internal pressure. The pressure at which the bonding process is carried-out may be greater the desired pressure within cavity 36 if the bonding process is performed under elevated temperature conditions. To provide a non-limiting example, if it is desired for the pressure within MEMS cavity 36 to be approximately 1 atmosphere (as may be the case when MEMS transducer structure 30 is an accelerometer transducer structure), the bonding process may be carried-out at a pressure of 2-4 atmosphere and at an elevated temperature such that the desired pressure is achieved within cavity 36 upon cooling of microelectronic package 20. Air, nitrogen, or another inert gas can be sealed within cavity 36 during the bonding process.

Electrically-conductive bodies may also be deposited at selected locations between cap piece wafer 42 and sensor wafer 28 to provide electrical interconnect therebetween. One such electrically-conducive body 51 is shown in FIG. 2, which interconnects one or more electrically-conductive routing features exposed on frontside 24 of die 22 (e.g., a TSV 35) with one or more electrically-conductive routing features provided on the inner surface of cap piece 34 (e.g., an aligning TSV 44). In embodiments wherein the bonding material utilized to join cap piece wafer 42 and sensor wafer 28 is electrically conductive, electrically-conductive body 51 and the other electrically-conductive bodies may be formed in conjunction with seal rings 46 and 48 by plating or otherwise depositing discrete columns, globs, or lines of the electrically-conducive bonding material on selected areas of wafers 28 and 42 prior to wafer bonding. Electrical interconnection can also be provided through seal rings 46 and 48, if desired.

Figure 3:
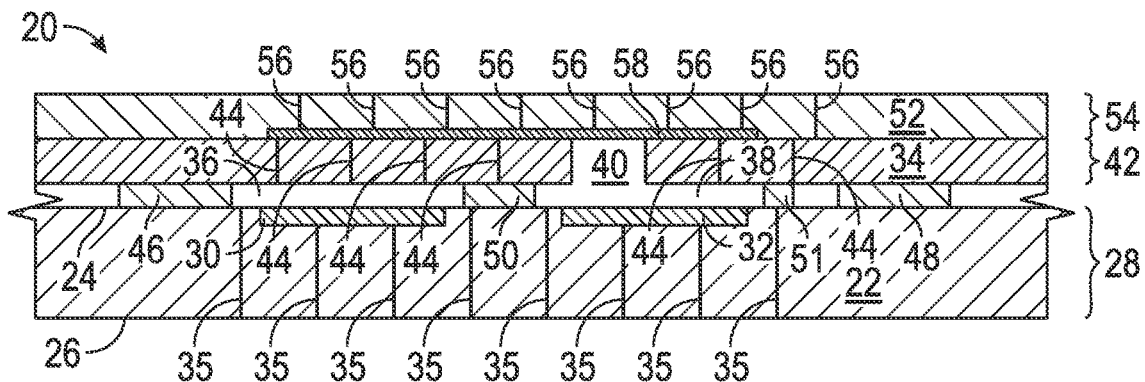

After the above-described bonding process, MEMS cavity 36 is hermetically sealed and contains a first predetermined pressure tailored to optimize the performance of transducer structure 30. Neighboring MEMS cavity 38 remains vented to the surrounding pressure or atmosphere by vent hole 40 formed in cap piece 34. MEMS cavity 38 may now be sealed under process conditions sufficient to entrap a second predetermined pressure within cavity 38, which is selected for optimization of MEMS transducer structure 32. This may be accomplished by bonding a second cap piece 52 over vent hole 40 to seal MEMS cavity 38. For example, as indicated in FIG. 3, second cap piece 52 may be bonded to first cap piece 34 opposite sensor die 22 such that cap piece 52 covers or sealingly encloses vent hole 40. Bonding is again carried-out under process conditions sufficient to create the desired pressure within MEMS cavity 38. In an embodiment wherein MEMS transducer structure 32 is a gyroscope transducer structure, a relatively low (e.g., near vacuum) pressure may be sealed within cavity 38. Cap pieces 34 and 52 may be joined utilizing a non-illustrated bonding material, such as an electrically-conductive bonding material of the type described above. As was previously the case, cap piece 52 is preferably bonded to cap piece 34 in wafer form; e.g., as shown in FIG. 3, cap piece 52 may be included within a second cap piece wafer 54, which contains a number of other non-illustrated cap pieces. In such embodiments, bonding of cap piece wafer 54 to cap piece wafer 42 results in the production of a three wafer stack 28, 42, 54. Finally, a number of TSVs 56 may once again be formed through cap piece 52 and, more generally, through cap piece wafer 54 for interconnectivity purposes.

While still incomplete, microelectronic package 20 has now been produced to include two fluidly-isolated cavities (i.e., MEMS cavities 36 and 38), which contain disparate internal pressures selected to optimize the performance of the transducer structures enclosed thereby. Notably, the above-described process utilized to form hermetically-sealed cavities 36 and 38 is relatively straightforward and can be performed on wafer level to enable the simultaneous production of a number of microelectronic packages including package 20. Additionally, the usage of two solid cap pieces or bodies to seal MEMS cavities 36 and 38 provides superior mechanical strength and seal integrity as compared to this film structures. Still further benefits can be realized by fabricating cap piece 34 or cap piece 52 to include an Application Specific Integrated Circuit (ASIC). To this end, an ASIC 58 may be fabricated on surface of cap piece 52 bonded to cap piece 34, as generically illustrated in FIG. 3. By eliminating the need for a separate ASIC die through the usage of such a "smart cap," further reductions in size and cost of microelectronic package 20 can be realized. In embodiments wherein ASIC 58 is fluidly coupled to hermetic cavity 38, as is the case in the illustrated example, it may be preferred that the MEMS transducer structure enclosed by cavity 38 (i.e., transducer structure 32) is generally insensitive to pressure fluctuations that can occur due to outgassing of ASIC 58. Thus, in such an implementation, MEMS transducer structure 32 may be an accelerometer transducer structure, while MEMS transducer structure 30 may be gyroscope transducer structure.

Figure 4:
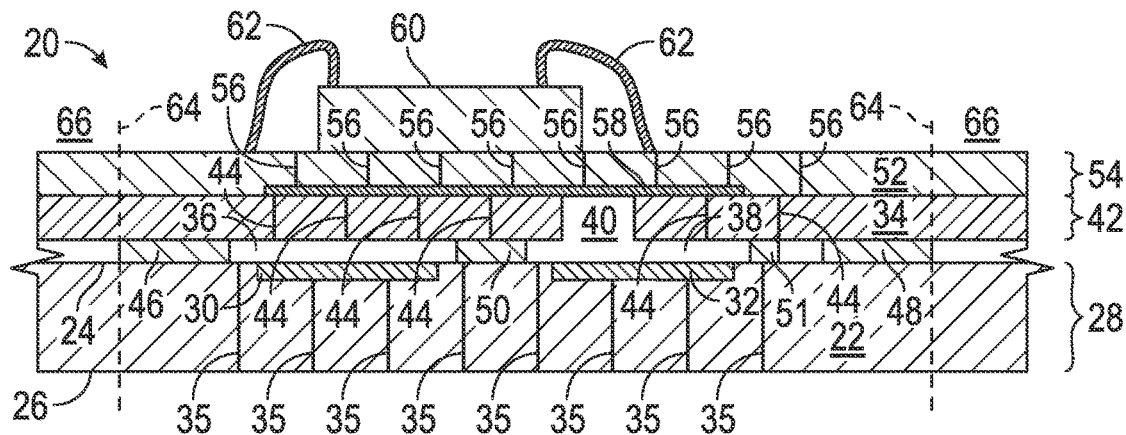

In certain embodiments, the only sensors included within microelectronic package 20 may be the MEMS devices associated with the transducer structures 30 and 32 and sealingly enclosed by hermetic cavities 36 and 38, respectively. However, in further embodiments, one or more additional sensors may be integrated into microelectronic package 20, which are not formed on sensor die 22. For example, as shown in FIG. 4, a magnetometer die 60 carrying a solid state three axis magnetometer may be stacked onto cap piece 52 and interconnected therewith by, for example, wire bonds 62. In this manner, microelectronic package 20 can be produced to include at least nine DOFs, as may be desirable when package 20 is an inertial measurement unit. Magnetometer die 60 may be positioned over cap piece wafer 54 utilizing a pick-and-place tool and secured in its desired position by, for example, a layer of die attach material (not shown). Die 60 may then be electrically coupled to cap piece 52 by wirebonding (shown in FIG. 4) or utilizing another type of interconnection feature. Afterwards, wafer stack 28, 42, 54 may be singulated, as indicated in FIG. 4 by dashed lines 64. Singulation is conveniently carried-out utilizing a dicing saw, which is directed through wafer stack 28, 42, 54 along saw lanes 66; however, other singulation techniques can be utilized to separate the wafer stack into discrete pieces including, for example, laser cutting and scribing with punching.

Conventional processing steps may now be performed to complete fabrication of microelectronic package 20 and the other packages produced from wafer stack 28, 42, 54. The particular processing steps will vary depending whether a Fan-In Wafer Level Packaging (FI-WLP) approach, a Fan-Out Wafer Level Packaging (FO-WLP) approach, or another packaging approach is employed. In the illustrated embodiment, and by way of non-limiting example only, a FO-WLP encapsulation process is performed during which a pick-and-place tool is used to position partially-completed microelectronic package 20 along with a number of other packages within the central opening of a taped mold frame. An encapsulant, such as a dielectric mold compound, is then dispensed into the mold frame and over the array of incomplete packages. The encapsulant is thermally cured to produce a molded panel in which the array of semiconductor die is embedded, and the taped mold frame is removed to reveal the frontside of the molded panel through which the semiconductor die are exposed. A carrier may then be attached to the panel backside to allow a number of Redistribution Layers (RDLs), as well as a Ball Grid Array (BGA) or other contact array, to be formed over the panel frontside and the die exposed therethrough. The RDLs may include successively-deposited dielectric layers in which a number of metal traces or interconnect lines are formed to provide electrically-conductive paths between the bond pads of the embedded die and the overlying BGA. Finally, the molded panel may be singulated to yield a number of microelectronic packages, which each contain a sensor die 22, a cap piece 34, a cap piece 52, and a magnetometer die 60 similar to that shown in FIG. 5, as described below.

Figure 5:
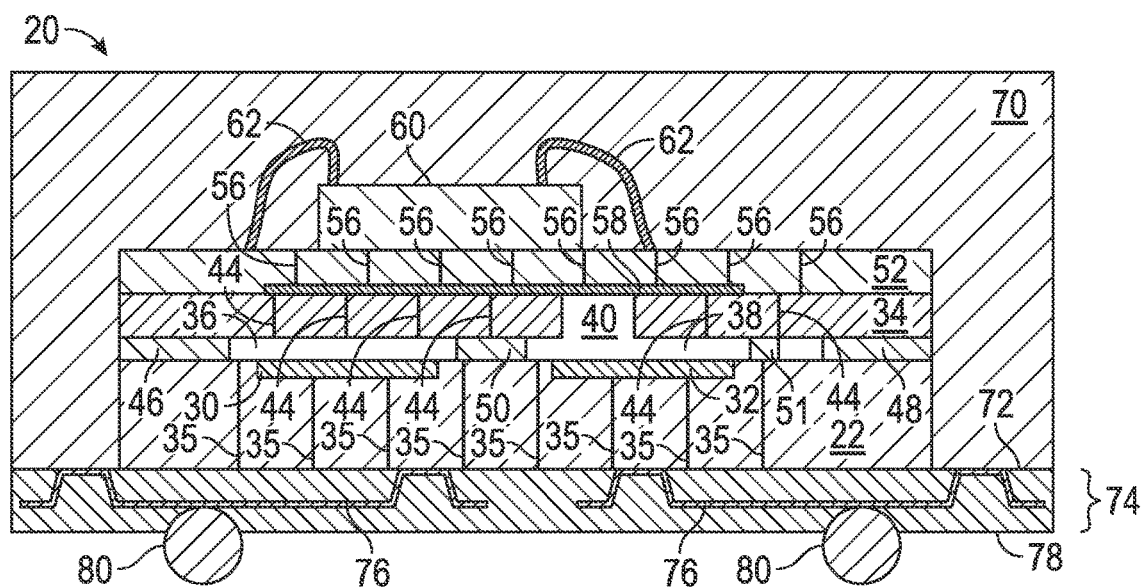

FIG. 5 illustrates microelectronic package 20 in a completed state after performance of the above-described FO-WLP packaging process. As can be seen, sensor die 22, cap piece 34, cap piece 52, and magnetometer die 60 have been encapsulated within a molded package body 70 having a frontside 72. A number of RDLs 74 have been built-up over frontside 72 of package body 70. RDLs 74 are produced to include a network of interconnect lines 76 disposed within a body of dielectric material 78. Interconnect lines 76 may comprise various metal traces, vias, metal plugs, and/or the like, which collectively provide electrically-conductive paths between the upper surface of frontside RDLs 74 and TSVs 35 and, therefore, the MEMS devices carried by sensor die 22, ASIC 58 carried by cap piece 34, and magnetometer die 60. Dielectric body 78 may be formed as a number of successively-deposited (e.g., spun-on) dielectric layers, while interconnect lines 76 may be formed within body 78 utilizing well-known lithographical patterning and conductive material (e.g., copper) deposition techniques;

e.g., in one embodiment, each metal level may be produced by patterning a mask layer deposited over a seed layer, plating exposed regions of the seed layer with copper or another metal, and then removing the mask layer to define the desired electrically-conductive features. A contact array may be formed over RDLs 74 to provide externally-accessible points-of-contact to interconnect lines 76 (and, therefore, signal communication to the packaged devices). For example, bumping may be performed to produce a BGA including a plurality of solder balls 80 over the outermost RDL 74 and in ohmic contact with interconnect lines 76, as generally shown in FIG. 5.

The foregoing has thus provided an exemplary embodiment of a fabrication method suitable for producing microelectronic packages containing multiple fluidly-isolated cavities, which enclose different MEMS transducer structures and which contain disparate pressures tailored to the MEMS transducer structure contained within the cavity. Advantageously, the above-described dual cap architecture enables the formation of structurally robust hermetic cavities. Additionally, in embodiments wherein an ASIC is formed on the first cap piece, the second cap piece, or both the first and second cap pieces, the need for a discrete ASICs die of the type conventionally included within known microelectronic packages can be eliminated to further reduce package height and fabrication costs. As an additional benefit, the processing steps utilized to produce the hermetically-sealed cavities can be performed entirely on a wafer level to improve manufacturing efficiency. Furthermore, by electrically interconnect sensor die 22, cap piece 34, and cap piece 52 utilizing TSVs, the need for wire bonds and saw-to-reveal processes can be eliminated or minimized to further reduce the planform dimensions of the package. In the above-described exemplary embodiment, sensor die 22, cap piece 34, cap piece 52, and magnetometer die 60 were integrated into a particular type of package, namely, the FO-WLP shown in FIG. 5. The foregoing example notwithstanding, the sensor die, the cap pieces, and any other microelectronic components included within the package may be incorporated into a different package type in further embodiments. To further emphasize this point, an exemplary embodiment of a microelectronic package including a dual cap construction and packaged utilizing a Fan-In Wafer Level Packaging process will now be described below in conjunction with FIG. 6.

Figure 6:
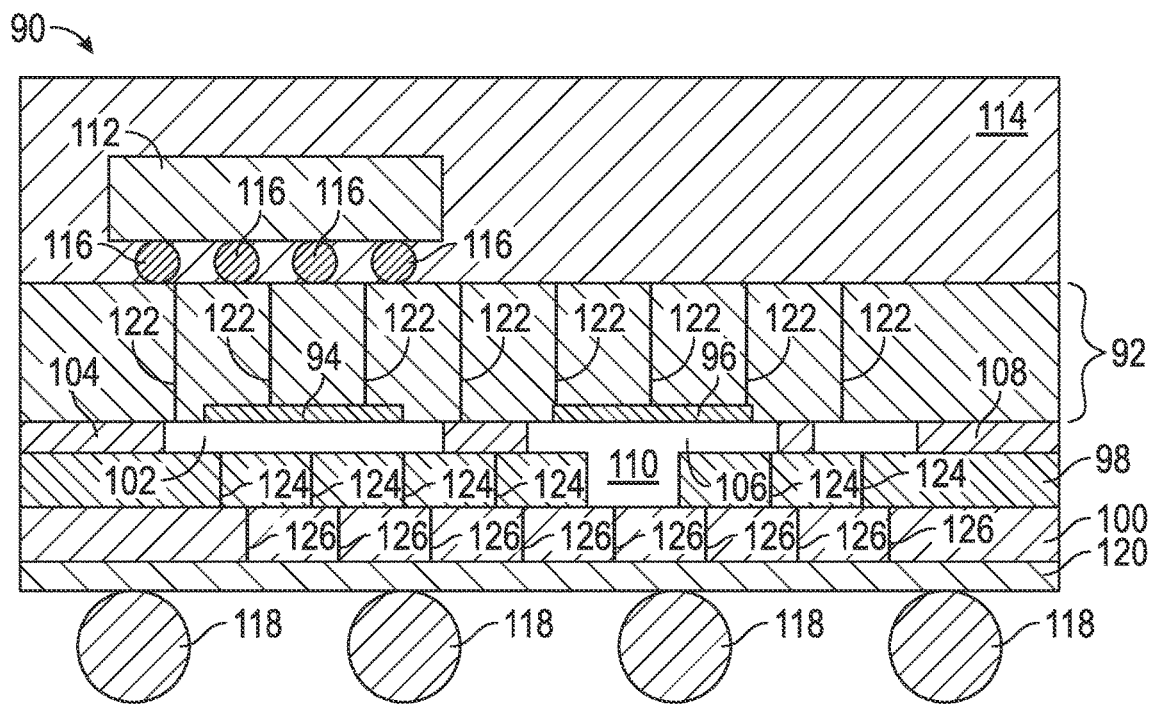
FIG. 6 is a simplified cross-sectional view of a microelectronic package including two fluidly-isolated cavities sealed by two cap pieces positioned on the same side of a sensor die, as illustrated in accordance with a further exemplary embodiment of the present invention.

FIG. 6 is a simplified cross-sectional view of a Fan-In Wafer Level Package 90, as illustrated in accordance with a further exemplary embodiment. In many respects, Fan-In Wafer Level Package 90 is similar to Fan-Out Wafer Level Package 20 described above in conjunction with FIGS. 1-5. For example, package 90 includes a sensor die 92 having a first MEMS transducer structure 94 and a second MEMS transducer structure 96 formed thereon. A first cap piece 98 is bonded to the frontside of die 92 on which MEMS transducer structures 94 and 96 are located, and a second cap piece 100 is bonded to cap piece 98 opposite sensor die 92. A first hermetic cavity 102 sealingly encloses MEMS transducer structure 94 and is defined or bound by die 92, a seal ring 104, and cap piece 98. Similarly, a second hermetic cavity 106 sealingly encloses MEMS transducer structure 96 and is defined or bound by die 92, a seal ring 108, cap piece 98, and cap piece 100. A vent hole 110 is formed through cap piece 98 and fluidly coupled to cavity 106. In this manner, cap piece 98 can be bonded to die 92 to seal a first pressure within cavity 102 during fabrication of package 90, while cavity 106 remains vented to the surrounding pressure. Cap piece 100 may then be bonded over cap piece 98 to cover vent hole 110 and thereby seal a second pressure within cavity 106 in manner similar to that described above in conjunction with FIG. 3. The pressures sealed within fluidly-isolated cavities 102 and 106 may thus be selected to best suit the particular MEMS transducer structures enclosed thereby.

As does package 20 described above in conjunction with FIGS. 1-5, microelectronic package 90 includes a magnetometer die 112 embedded within a molded package body 114. However, in the embodiment shown in FIG. 6, a BGA 116 is utilized to provide the desired interconnections between magnetometer die 112 and sensor die 92. Thus, in contrast to package 20 (FIGS. 1-5), microelectronic package 90 may lack wire bonds. As a further difference, microelectronic package 90 is packaged utilizing a FI-WLP approach; consequently, package body 114 does not include a fan-out region surrounding sensor die 92, cap piece 98, and cap piece 100 and is instead formed over the backside of sensor die 92. An I/O interface 120 including a contact array 118 is formed over cap piece 100 to provide electrical communication with the microelectronic devices contained within package 90. I/O interface 120 can include or assume the form of one or more RDLs of the type described above, a leadframe, an interposer, or any other structure or body suitable for providing externally-accessible points-of-contact enabling electrical communication with the microelectronic devices contained within package 90. Relative to sensor die 22 shown in FIG. 5, the orientation of sensor die 92 is inverted. The active surface or frontside of sensor die 92 thus faces toward I/O interface 120 in the embodiment shown in FIG. 6, and cap pieces 98 and 100 are disposed between die 92 and I/O interface 120. As further indicated in FIG. 6, TSVs 122, 124, and 126 can be formed through sensor die 92, cap piece 98, and/or cap piece 100, respectively, to provide signal communication between the devices contained within package 90 and I/O interface 120.

As indicated above, the microelectronic package need not be produced to include a magnetometer die or any other microelectronic component beyond the MEMS structure or structures enclosed within the above-described hermetically-sealed cavities in all embodiments. Thus, in further implementations, package 90 (FIG. 6) may be produced without die 112 and, perhaps, without molded package body 114. In such embodiments, sensor die 92 can be produced without TSVs 122 and electrical interconnection between the circuitry on the frontside of die 92 and I/O interfaced 120 may be provided through the electrically-conductive bonding material joining die 92 to cap piece 98, through TSVs 124 formed in cap piece 98, and through TSVs 126 formed in cap piece 100. This can be advantageous in that sensor die 92 may be relatively thick and, therefore, the formation of TSVs therethrough can be difficult or costly from a manufacturing perspective. In contrast, cap pieces 98 and 100 are typically considerably thinner than is sensor die 92, and TSVs can consequently be formed through cap pieces 98 and 100 in a relatively straightforward and cost effective manner.

Figure 7:
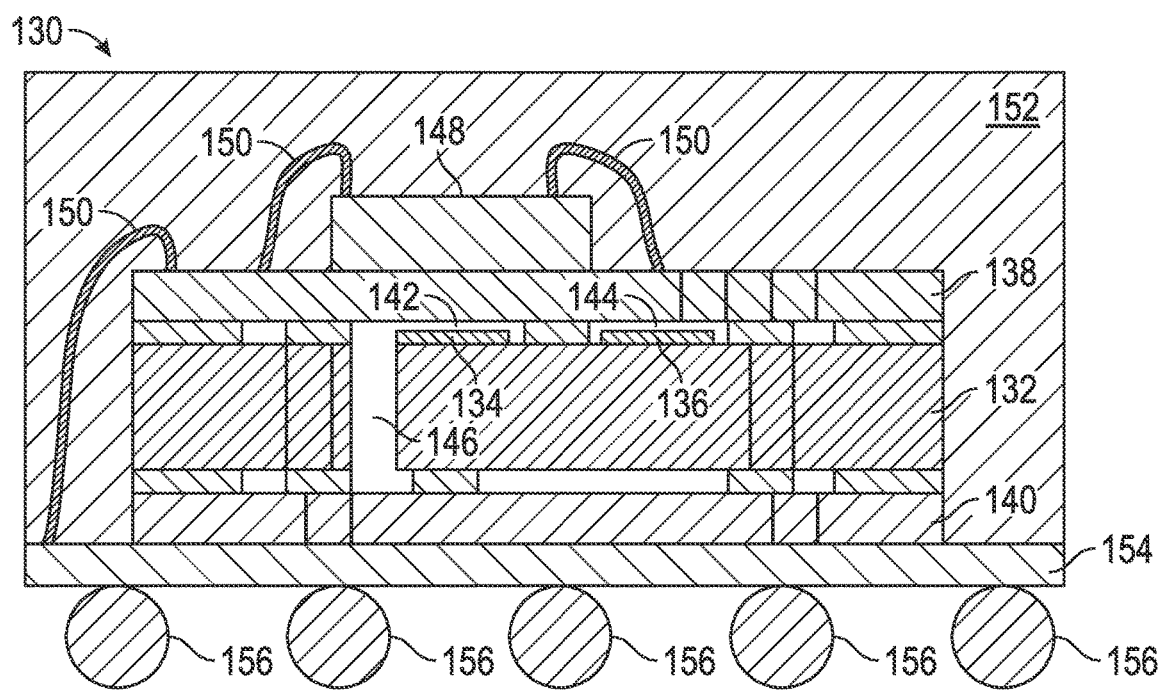
FIG. 7 is a simplified cross-sectional view of a microelectronic package including two fluidly-isolated cavities sealed by two cap pieces positioned on opposing sides of a sensor die, as illustrated in accordance with a still further exemplary embodiment of the present invention.

In the above-described exemplary embodiments, two cap pieces were bonded on the same side of the sensor die, and one or more vent holes were provided in one of the cap pieces. In further embodiments, the vent hole or holes can be formed through a different structure bounding one of the hermetic cavities, which is able to be sealed at a later stage of manufacture by, for example, bonding a second cap piece over the structure in which the vent hole is formed. Further emphasizing this point, FIG. 7 is a simplified cross-sectional view of microelectronic package 130 including a sensor die 132 on which first and second MEMS transducer structures 134 and 136 are formed. Microelectronic package 130 further includes first and second cap pieces 138 and 140, which seal a first cavity 142 enclosing MEMS transducer structure 134 and a second cavity 144 enclosing MEMS transducer structure 136, respectively. As was previously the case, a vent hole 146 is formed in fluid communication with cavity 142. However, in the embodiment shown in FIG. 7, vent hole 146 is formed through the body of sensor die 132. During fabrication of package 130, cap piece 138 may first be bonded to the frontside of sensor die 132 under controlled process conditions to seal a first desired pressure in cavity 144, while cavity 142 remains vented to the surrounding pressure through vent hole 146. Afterwards, second cap piece 140 may be bonded to the opposing backside of sensor die 132 to cover vent hole 146 and thereby seal a second desired pressure within cavity 142. Additional processing steps may then be performed to complete fabrication of package 130 in the previously described manner. For example, a magnetometer die 148 may be stacked onto cap piece 138; wire bonds 150 or other interconnections may be formed; and an encapsulation process can optionally be carried-out to embed sensor die 132, cap piece 138, cap piece 140, and magnetometer die 148 in a molded package body 152. An I/O structure 154 may then be produced over the frontside of molded package body 152; and a BGA or other contact array 156 may be produced over I/O structure 154.

As noted above, favorable reductions in package size and manufacturing cost can be realized by producing one or both of the cap pieces as a "smart cap" bearing an ASICs or other circuitry. Thus, in the case of microelectronic package 90 shown in FIG. 6, an ASICs may be produced on cap piece 98 or 100; and, in the case of package 130 shown in FIG. 7, an ASIC may be produced on cap piece 138 or 140. In embodiments wherein the microelectronic package is produced to include one or more additional microelectronic components beyond the sensor die and cap piece or pieces, which are smaller in size than is the sensor die and/or cap pieces, package size may still further be reduced by housing or nesting one or more microelectronic components in a recess formed in the cap pieces or the sensor die. The additional microelectronic component may be a three axis magnetometer die, which can be combined with a three axis accelerometer and a three axis gyroscope to yield a highly compact microelectronic package having at least 9 DOFs. Two exemplary embodiments of microelectronic packages having such a nested configuration are described below in conjunction with FIGS. 8 and 9.

Figure 8:
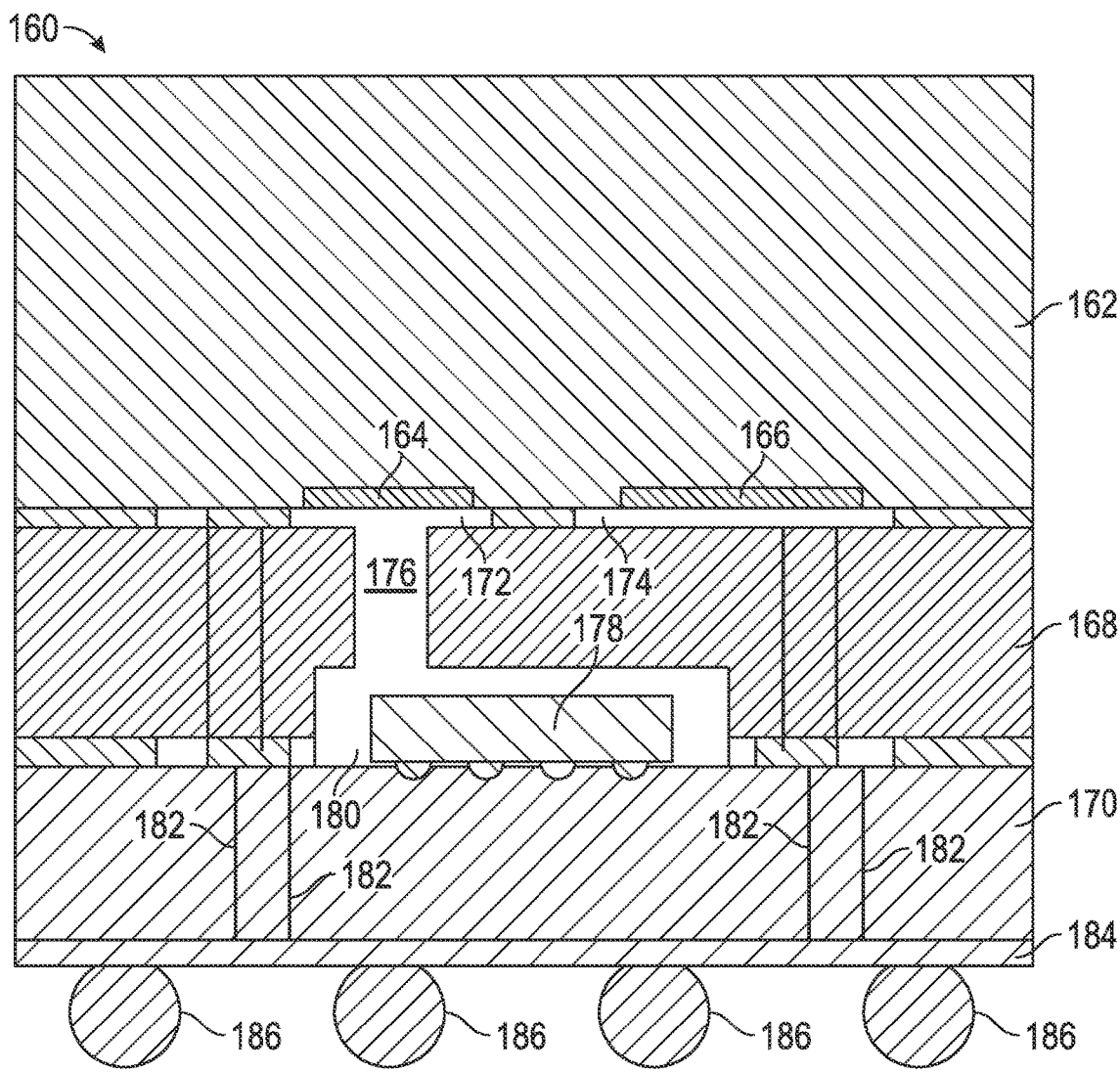
FIG. 8 is a simplified cross-sectional view of a microelectronic package including two fluidly-isolated cavities sealed by two cap pieces positioned on the same side of a sensor die wherein an additional microelectronic component is nested within a recess formed in one of the cap pieces, as illustrated in accordance with a still further exemplary embodiment of the present invention.

FIG. 8 is a simplified cross-sectional view of a microelectronic package 160, as illustrated in accordance with a further exemplary embodiment of the present invention. Microelectronic package 160 includes a sensor die 162 having first and second MEMS transducer structures 164 and 166 formed thereon, a first cap piece 168 bonded to the frontside of die 162, and a second cap piece 170 bonded to cap piece 168 opposite sensor die 162. MEMS transducer structures 164 and 166 are sealingly enclosed in first and second hermetic cavities 172 and 174, respectively. A vent hole 176 is provided through cap piece 168 and fluidly coupled to cavity 172. During fabrication of package 160, cap piece 168 may first be bonded over sensor die 162 to seal a known pressure within cavity 174, while cavity 172 remains vented to a surrounding pressure through vent hole 176. Cap piece 170 may then be bonded to cap piece 168 to enclose vent hole 176 and thereby seal a predetermined pressure within cavity 172, which is different than the pressure contained within cavity 174. Prior to bonding cap piece 170 to cap piece 168, at least one microelectronic component 178 (e.g., a magnetometer die) may be bonded to the underside of cap piece 170 and electrically interconnected to signal routing features (e.g., TSVs 182) provided thereon. When cap piece 170 is properly aligned to cap piece 168, component 178 is received within a recess 180 previously formed in cap piece 168 by, for example, bulk etching of the cap piece wafer. Thus, pursuant to bonding of cap piece 170, recess 180 is placed in fluid communication with cavity 172 through vent hole 176. Conventional processing steps may then performed to complete fabrication of package 160 including the formation of an I/O interface 184 including a contact array 186 over cap piece 170.

Figure 9:
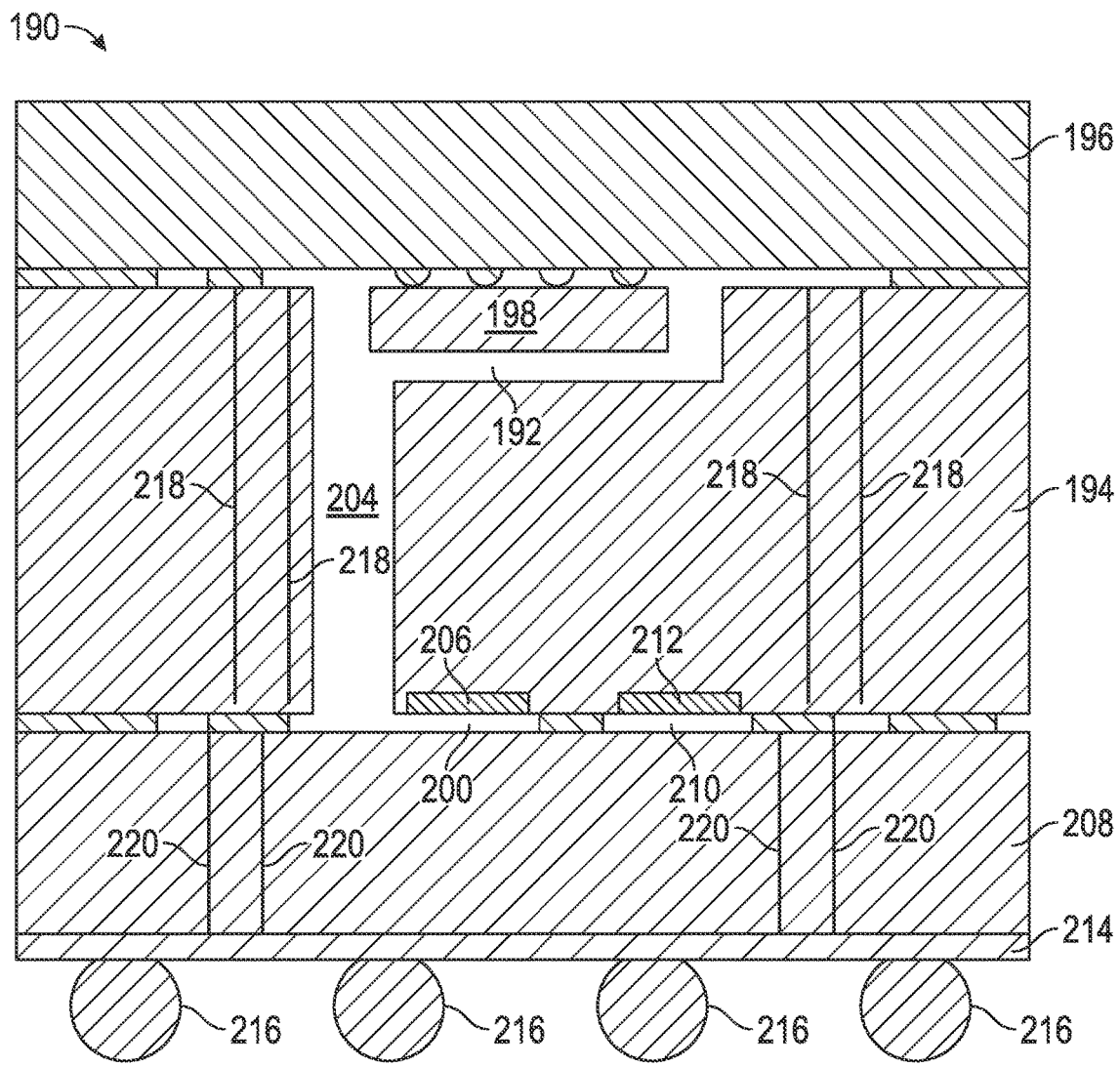
FIG. 9 is a simplified cross-sectional view of a microelectronic package including two fluidly-isolated cavities sealed by two cap pieces positioned on opposing sides of a sensor die wherein an additional microelectronic component is nested within a recess formed in the sensor die, as illustrated in accordance with a still further exemplary embodiment of the present invention.

Due to the nesting of component 178 within recess 180 of cap piece 168, microelectronic package 160 may be imparted with a reduced height or thickness relative to a comparable package wherein microelectronic component 178 is stacked onto the backside of sensor die 162. As indicated above, the recess in which component 178 is housed can be formed in one of the cap pieces (e.g., cap piece 168 shown in FIG. 8); however, in further embodiments, the component-receiving recess can be formed within the sensor die itself. For example, as shown in FIG. 9, a microelectronic package 190 can be produced wherein a recess 192 is etched or otherwise formed in a sensor die 194. In this case, recess 192 matingly receives a microelectronic component 198, which is bonded to the underside of a cap piece 196 and which is electrically interconnected with the other circuitry of package 190 through piece 196. Furthermore, in the embodiment shown in FIG. 9, recess 192 fluidly communicates with a cavity 200 enclosing a first MEMS transducer structure 206 through a vent hole 204 formed in sensor die 194. Hermetic cavity 202 is partially bound by a second cap piece 208, which is sealingly bonded to sensor die 194 opposite cap piece 196. Second cap piece 208 likewise encloses a second hermetic cavity 210, which contains second MEMS transducer structure 212 formed on sensor die 194. An I/O interface 214 including a contact array 216 may further be formed over cap piece 208. As indicated in FIG. 9, TSVs 218 and 220 may be provided through sensor wafer 194 and cap piece 208 to allow signal communication between component 198, the circuitry formed on the frontside of sensor die 194, and I/O interface 214. Once again, an ASICs may be formed in cap piece 196 or cap piece 208. Such nested configuration enables the height of microelectronic package 190 to be reduced, while the dual cap construction of package 190 provides structurally robust, high integrity hermetic cavities containing disparate pressures to enhance the performance of the MEMS transducer structures.

There have thus been provided multiple exemplary embodiments of a microelectronic package including two or more MEMS transducer structures, such as accelerometer and gyroscope transducer structures, which are sealingly enclosed in separate, fluidly-isolated cavities in a structurally robust manner. Embodiments of the above-described microelectronic package may have a reduced size and manufacturing cost as compared conventional microelectronic packages due to, for example, the usage of one or more cap pieces having an ASICs formed thereon. The foregoing has also provided embodiments of a method for producing a highly compact microelectronic package, which includes a magnetometer die or the relatively small microelectronic component internal to the package and nested within a recess formed within a sensor die or a cap piece. In certain embodiments, the microelectronic package may include a three axis gyroscope enclosed within a first hermetic cavity sealed by a first cap piece, a three axis accelerometer enclosed within a second hermetic cavity sealed by a second cap piece, and a magnetometer housed within a recess formed in the first cap piece, the second cap piece, or the sensor die on which the gyroscope and accelerometer are formed. In this manner, a highly compact and structurally robust microelectronic package can be produced having at least 9 DOFs. As a still further advantage, the above-described packages can be produced, at least in large part, on a wafer level to bring about improvements in manufacturing efficiency.

In one embodiment, the above-described microelectronic package includes a sensor die having first and second MEMS transducer structures formed thereon. First and second cap pieces coupled to the sensor die by, for example, direct or indirect bonding. A first hermetic cavity encloses the first MEMS transducer structure and is at least partially defined by the first cap piece and the sensor die. Similarly, a second hermetic cavity encloses the second MEMS transducer structure and is at least partially defined by the second cap piece and the sensor die. The microelectronic package further includes a vent hole, which is in fluid communication with the first hermetic cavity and which is sealed by the second cap piece. The vent hole may be formed through the first cap piece (in which case the second cap piece may be bonded to the first cap piece opposite the sensor die) or through the sensor die (in which case the second cap piece may be bonded to the sensor die opposite the first cap piece).

In a further embodiment, the microelectronic package includes a sensor die having a frontside surface, a first MEMS transducer structure formed on the frontside surface, and a first cap piece bonded to frontside surface of the sensor die and extending over the first MEMS transducer structure. A first hermetic cavity encloses the first MEMS transducer structure and is defined, at least in part, by the sensor die and the first cap piece. A recess, which is formed in the sensor die and/or the first cap piece, fluidly communicates with the first hermetic cavity. A magnetometer die or other microelectronic component is housed within the recess.

Methods for fabricating a microelectronic package have also been provided. The microelectronic package includes first and second MEMS transducer structures formed on a sensor die and enclosed within first and second cavities, respectively. In one embodiment, the method includes the step or process of bonding a first cap piece to a sensor die to seal the first cavity at a first predetermined pressure, while venting the second cavity to a surrounding pressure. A second cap piece is then bonded to one of the sensor die and the first cap piece to seal the second cavity at a second predetermined pressure different than the first predetermined pressure.

While at least one exemplary embodiment has been presented in the foregoing Detailed Description, it should be appreciated that a vast number of variations exist. It should also be appreciated that the exemplary embodiment or exemplary embodiments are only examples, and are not intended to limit the scope, applicability, or configuration of the invention in any way. Rather, the foregoing Detailed Description will provide those skilled in the art with a convenient road map for implementing an exemplary embodiment of the invention. It being understood that various changes may be made in the function and arrangement of elements described in an exemplary embodiment without departing from the scope of the invention as set-forth in the appended claims.

What is claimed is:

1. A microelectronic package, comprising:
   first and second Microelectromechanical Systems (MEMS) transducer structures formed on a sensor die and enclosed within first and second cavities, respectively;
   a first cap piece bonded to the sensor die to seal the first cavity at a first predetermined pressure;
   a vent hole fluidly coupled to the second cavity;
   a second cap piece bonded to the first cap piece opposite the sensor die, covering the vent hole, and sealing the second cavity at a second predetermined pressure different than the first predetermined pressure; and
   an Application Specific Integrated Circuit (ASIC) formed on the second cap piece and fluidly coupled to the second cavity through the vent hole.

2. The microelectronic package of claim 1 wherein the second cap piece is bonded to the first cap piece opposite the sensor die.

3. The microelectronic package of claim 1 further comprising:
   Through Silicon Vias (TSVs) formed through the sensor die; and
   a contact array formed over the sensor die opposite the first cap piece.

4. The microelectronic package of claim 1 further comprising bonding material attaching the first cap piece to the sensor die and providing a vertical standoff therebetween, a portion of the bonding material disposed between and partitioning the first and second cavities.

5. The microelectronic package of claim 1 further comprising:
   electrically-conductive bonding material attaching the first cap piece to the sensor die; and
   a contact array formed over the sensor die opposite the first cap piece.

6. The microelectronic package of claim 1 further comprising a magnetometer die bonded to the second cap piece opposite the first cap piece.

7. The microelectronic package of claim 6 further comprising a contact array formed over the sensor die opposite the first cap piece, wherein the first MEMS transducer structure, the second MEMS transducer structure, the Application Specific Integrated Circuit, and the magnetometer die are electrically coupled to the contact array.

8. The microelectronic package of claim 1 further comprising interconnect lines providing electrically-conductive paths between the first and second MEMS transducer structures formed on the sensor die and the ASIC formed on the first cap piece.

* * * * *